(12) United States Patent
Parekh et al.

(10) Patent No.: US 10,903,220 B2
(45) Date of Patent: Jan. 26, 2021

(54) INTEGRATED ASSEMBLIES HAVING ANCHORING STRUCTURES PROXIMATE STACKED MEMORY CELLS, AND METHODS OF FORMING INTEGRATED ASSEMBLIES

(71) Applicant: Micron Technology, Inc., Boise, ID (US)

(72) Inventors: Kunal R. Parekh, Boise, ID (US); Justin B. Dorhout, Boise, ID (US); Nancy M. Lomeli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/578,042

(22) Filed: Sep. 20, 2019

(65) Prior Publication Data
US 2020/0013792 A1    Jan. 9, 2020

Related U.S. Application Data

(62) Division of application No. 15/843,509, filed on Dec. 15, 2017, now Pat. No. 10,446,566.

(51) Int. Cl.
| | | |
|---|---|---|
| *H01L 27/115* | (2017.01) | |
| *H01L 29/788* | (2006.01) | |
| *H01L 29/66* | (2006.01) | |
| *G11C 16/04* | (2006.01) | |
| *G11C 16/08* | (2006.01) | |
| *H01L 27/11556* | (2017.01) | |
| *H01L 27/1157* | (2017.01) | |
| *H01L 27/11582* | (2017.01) | |
| *H01L 27/11565* | (2017.01) | |
| *H01L 27/11519* | (2017.01) | |
| *H01L 27/11524* | (2017.01) | |

(52) U.S. Cl.
CPC ........ *H01L 27/11556* (2013.01); *G11C 16/08* (2013.01); *H01L 27/1157* (2013.01); *H01L 27/11519* (2013.01); *H01L 27/11524* (2013.01); *H01L 27/11565* (2013.01); *H01L 27/11582* (2013.01); *H01L 29/7883* (2013.01); *G11C 16/0483* (2013.01)

(58) Field of Classification Search
CPC .................................................. H01L 27/1157
See application file for complete search history.

(56) References Cited

U.S. PATENT DOCUMENTS

| | | | | |
|---|---|---|---|---|
| 2010/0276781 A1* | 11/2010 | Smith | .................. | H01L 29/7833 257/510 |
| 2014/0227842 A1* | 8/2014 | Lee | ..................... | H01L 29/7926 438/268 |

(Continued)

*Primary Examiner* — Omar F Mojaddedi
(74) *Attorney, Agent, or Firm* — Wells St. John P.S.

(57) ABSTRACT

Some embodiments include an assembly having channel material structures extending upwardly from a conductive structure. Anchor structures are laterally offset from the channel material structures and penetrate into the conductive structure to a depth sufficient to provide mechanical stability to at least a portion of the assembly. The conductive structure may include a first conductive material over a second conductive material, and may be a source line of a three-dimensional NAND configuration. Some embodiments include methods of forming assemblies to have channel material structures and anchor structures.

9 Claims, 18 Drawing Sheets

(56) References Cited

U.S. PATENT DOCUMENTS

2016/0211272 A1\* 7/2016 Koka ................ H01L 29/40117
2017/0025431 A1 1/2017 Kanakamedala et al.
2017/0358593 A1\* 12/2017 Yu ..................... H01L 27/11582

\* cited by examiner

INTEGRATED ASSEMBLIES HAVING ANCHORING STRUCTURES PROXIMATE STACKED MEMORY CELLS, AND METHODS OF FORMING INTEGRATED ASSEMBLIES

RELATED PATENT DATA

This patent resulted from a divisional of U.S. patent application Ser. No. 15/843,509 which was filed Dec. 15, 2017 which is hereby incorporated by reference herein.

TECHNICAL FIELD

Integrated assemblies having anchoring structures proximate stacked memory cells, and methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 100 which includes a memory array 102 having a plurality of memory cells 103 arranged in rows and columns along with access lines 104 (e.g., wordlines to conduct signals WL0 through WLm) and first data lines 106 (e.g., bitlines to conduct signals BL0 through BLn). Access lines 104 and first data lines 106 may be used to transfer information to and from the memory cells 103. A row decoder 107 and a column decoder 108 decode address signals A0 through AX on address lines 109 to determine which ones of the memory cells 103 are to be accessed. A sense amplifier circuit 115 operates to determine the values of information read from the memory cells 103. An I/O circuit 117 transfers values of information between the memory array 102 and input/output (I/O) lines 105. Signals DQ0 through DQN on the I/O lines 105 can represent values of information read from or to be written into the memory cells 103. Other devices can communicate with the device 100 through the I/O lines 105, the address lines 109, or the control lines 120. A memory control unit 118 controls memory operations to be performed on the memory cells 103 utilizing signals on the control lines 120. The device 100 can receive supply voltage signals Vcc and Vss on a first supply line 130 and a second supply line 132, respectively. The device 100 includes a select circuit 140 and an input/output (I/O) circuit 117. The select circuit 140 can respond, via the I/O circuit 117, to signals CSEL1 through CSELn to select signals on the first data lines 106 and the second data lines 113 that can represent the values of information to be read from or to be programmed into the memory cells 103.

The column decoder 108 can selectively activate the CSEL1 through CSELn signals based on the A0 through AX address signals on the address lines 109. The select circuit 140 can select the signals on the first data lines 106 and the second data lines 113 to provide communication between the memory array 102 and the I/O circuit 117 during read and programming operations.

The memory array 102 of FIG. 1 may be a NAND memory array, and FIG. 2 shows a block diagram of a three-dimensional NAND memory device 200 which may be utilized for the memory array 102 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 1.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

Three-dimensional integrated structures (e.g., three-dimensional NAND) may have a number of different materials vertically-stacked one atop another. Mechanical and/or thermal stresses may occur along interfaces where different materials contact one another, and such stresses may lead to delamination along the interfaces and/or to other failure mechanisms. It would be desirable to develop new architectures which alleviate failure mechanisms associated with conventional three-dimensional integrated structures, and to develop new methods of forming such architectures.

DETAILED DESCRIPTION OF THE ILLUSTRATED EMBODIMENTS

Some embodiments include three-dimensional integrated assemblies having vertically-stacked memory cells over a conductive structure (e.g., a conductive source line). The memory cells may be along vertically-extending channel material structures. Such channel material structures have channel material therein, and the channel material is electrically coupled with the conductive structure.

Anchor structures are provided adjacent the channel material structures, and extend into the conductive structure to a sufficient depth to provide mechanical stability which alleviates delamination and other failure mechanisms associated with conventional three-dimensional integrated assemblies.

In some embodiments, the three-dimensional integrated assemblies include three-dimensional NAND. The assemblies may be formed utilizing gate-replacement methodologies (i.e., replacing a sacrificial material with a conductive gate material in a three-dimensional stack).

Conventional methods may utilize a conductive source line configured to include a layer of conductively-doped silicon over a metal. The conventional methods may problematically expose the metal of the conductive source line to galvanic corrosion during removal of sacrificial material as part of a gate-replacement process. Such exposure may be due to openings for channel material pillars being extended so deeply into the conductive source line that the metal of the conductive source line becomes exposed during the gate replacement process. The openings may be extended deeply into the conductive source line in an attempt to have the channel material pillars be deeply rooted into the conductive source line to achieve strong mechanical coupling between the channel material pillars and the conductive source line. In contrast, methodologies of the present invention may enable the metal of the underlying source line to remain protected from galvanic corrosion in that the anchor structures provide mechanical stability so that the channel material structures do not need to be so deeply rooted into the conductive source line.

Example embodiments are described with reference to FIGS. 5-17.

Figure 1:
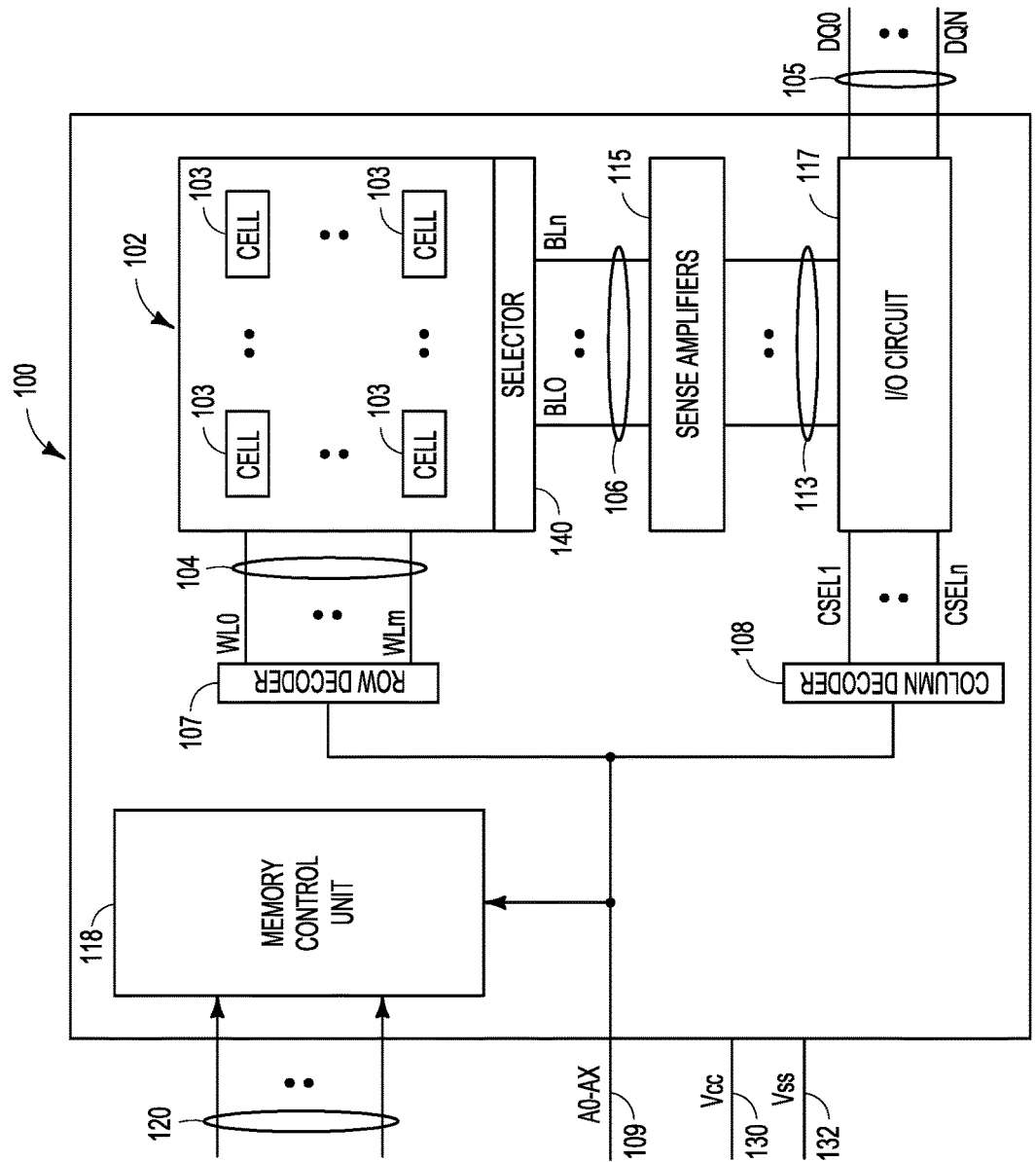
FIG. 1 shows a block diagram of a prior art memory device having a memory array with memory cells.
Figure 2:
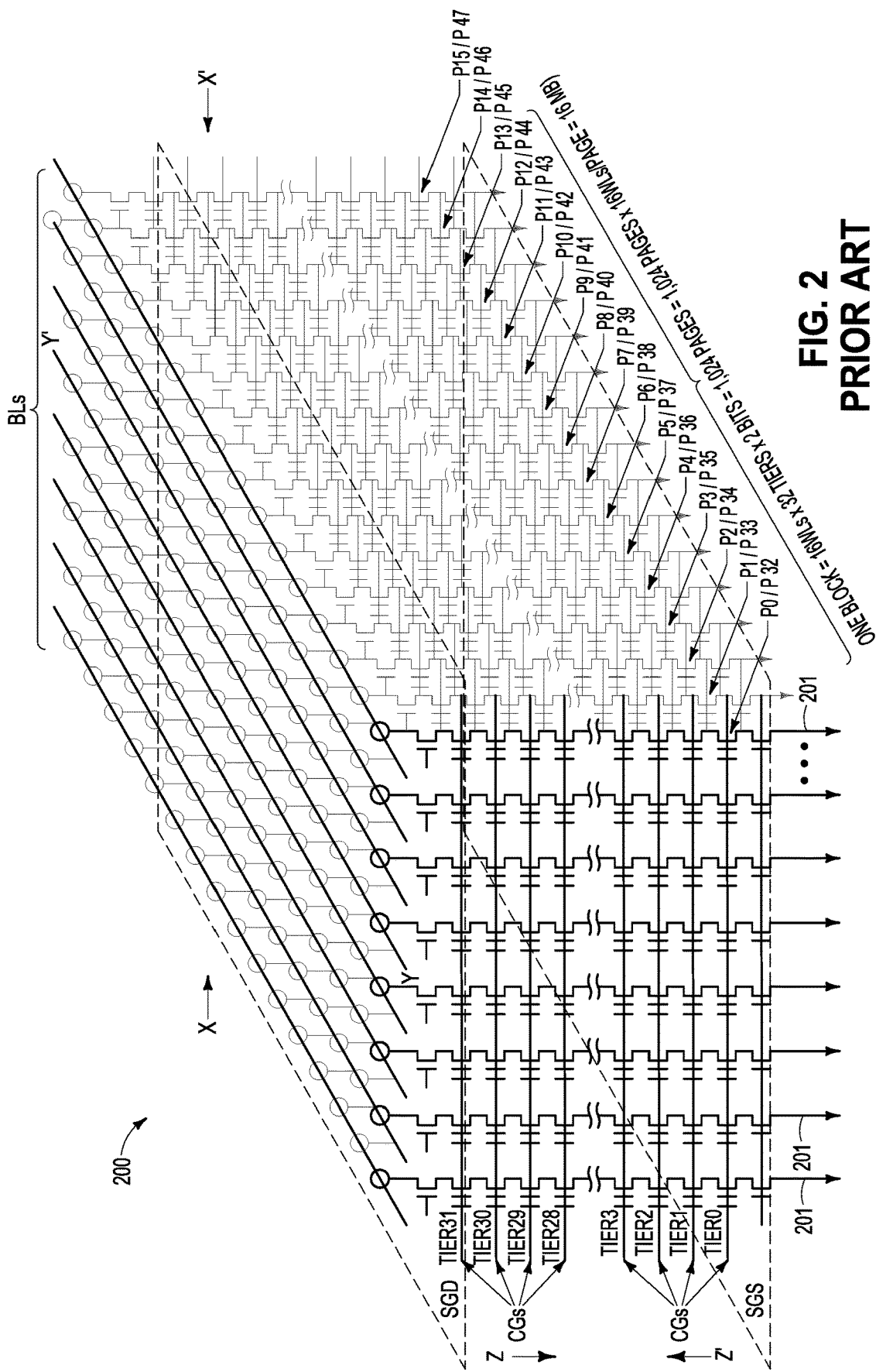
FIG. 2 shows a schematic diagram of the prior art memory array of FIG. 1 in the form of a 3D NAND memory device.
Figure 3:
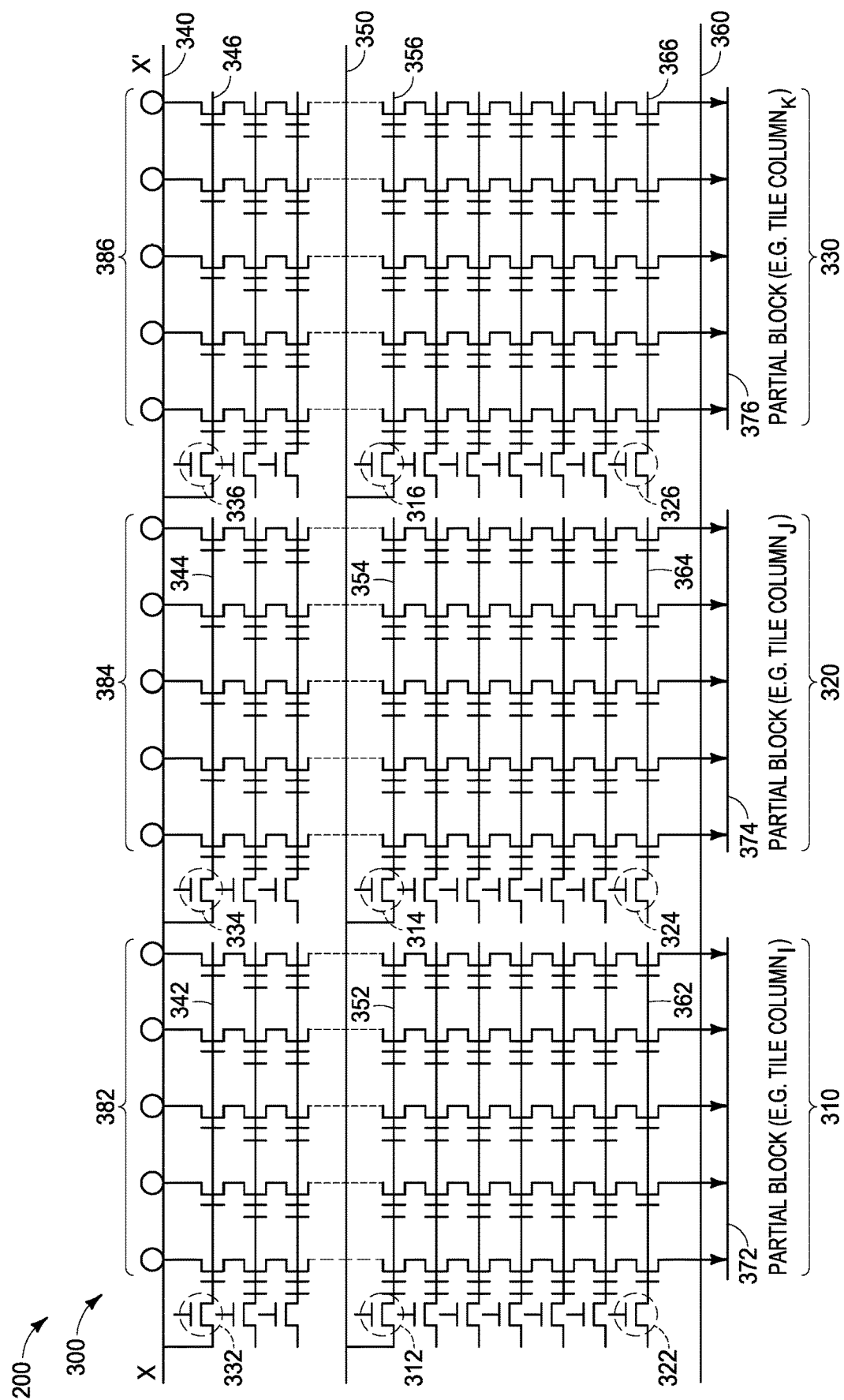
FIG. 3 shows a cross sectional view of the prior art 3D NAND memory device of FIG. 2 in an X-X' direction.
Figure 4:
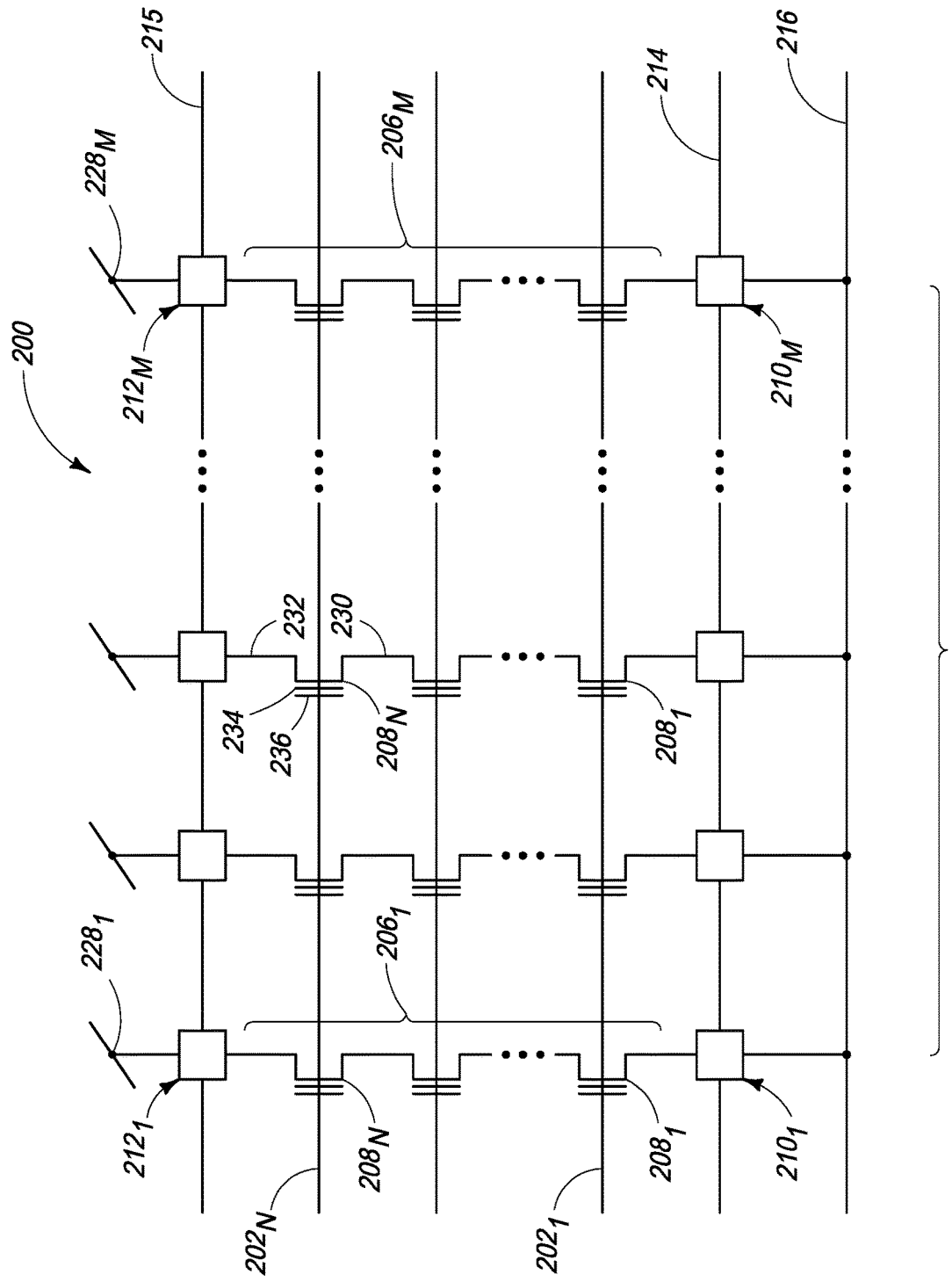
FIG. 4 is a schematic of a prior art NAND memory array.
Figure 5:
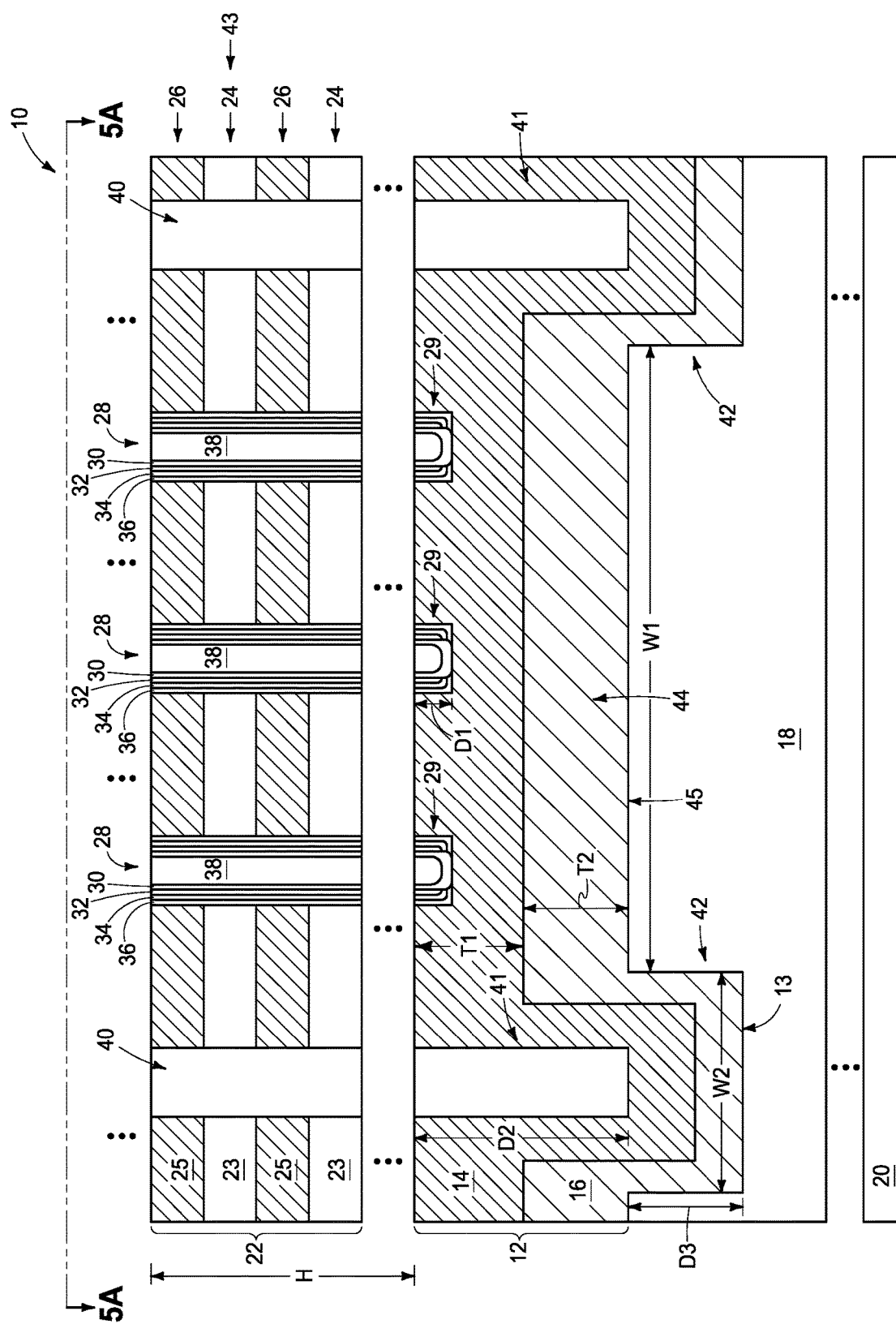
FIGS. 5-8 are diagrammatic cross-sectional views of integrated constructions comprising example assemblies with stacked memory cells and anchoring regions proximate the memory cells.

Referring to FIG. 5, a construction 10 (which may also be referred to as an integrated assembly, or integrated structure) includes a conductive structure 12 comprising a first conductive material 14 over a second conductive material 16.

The first conductive material 14 may comprise, consist essentially of, or consist of conductively-doped semiconductor material (e.g., one or more of conductively-doped silicon, conductively-doped germanium, etc.). The second conductive material 16 may include metal; and may, for example, comprise, consist essentially of, or consist of one or more metals (e.g., titanium, tungsten, cobalt, nickel, platinum, ruthenium, etc.) and/or metal-containing compositions (e.g., metal silicide, metal nitride, metal carbide, etc.). In some embodiments, the second conductive material 16 may comprise tungsten. For instance, the second conductive material 16 may comprise tungsten silicide adjacent a silicon-containing material 14, and may comprise tungsten beneath the tungsten silicide.

The conductive structure 12 is over an insulative material 18. Such insulative material may comprise any suitable composition or combination of compositions; and in some embodiments may comprise, consist essentially of, or consist of silicon dioxide.

The insulative material 18 is over a supporting base 20. The base 20 may comprise semiconductor material; and may, for example, comprise, consist essentially of, or consist of monocrystalline silicon. The base 20 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 20 may correspond to a semiconductor substrate containing one or more materials associated with integrated circuit fabrication. Such materials may include, for example, one or more of refractory metal materials, barrier materials, diffusion materials, insulator materials, etc.

A gap is shown between the base 20 and the insulative material 18 to diagrammatically indicate that there may be one or more additional materials, components, etc., provided between the base 20 and the insulative material 18. Alternatively, the insulative material 18 may be directly against an upper surface of the base 20.

A stack 22 of alternating first and second levels 24 and 26 is supported over the conductive structure 12. The levels 24 are dielectric, and the levels 26 are conductive. The stack 22 is shown to be spaced from the conductive structure 12 by a gap. Additional structures and/or components may be provided within such gap. For instance, in some embodiments the conductive structure 12 may correspond to a conductive source line within a NAND memory array, and the stack 22 may comprise vertically-stacked memory cells of the memory array. In such embodiments, select devices may be within the illustrated gap and utilized for coupling strings of the memory cells with the conductive source line.

The conductive levels 26 comprise conductive material 25. The conductive material 25 may comprise for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). For instance, in some embodiments memory cells are configured to comprise nitride as a charge-trapping material, and the conductive levels 26 may comprise n-type doped polycrystalline silicon (i.e., n-type doped polysilicon) of SONOS (semiconductor-oxide-nitride-oxide-semiconductor), or metal of MONOS (metal-oxide-nitride-oxide-semiconductor). An example MONOS is TANOS (tantalum-alumina-nitride-oxide-semiconductor).

The conductive levels 26 may correspond to wordlines, and may comprise control gates for memory cells. In some embodiments, the conductive levels may be referred to as memory cell levels of a NAND configuration. The NAND configuration includes a string of memory cells (a NAND string), with the number of memory cells in the string being determined by the number of memory cell levels 26. The NAND string may comprise any suitable number of memory cell levels. For instance, the NAND string may have 8 memory cell levels, 16 and memory cell levels, 32 memory cell levels, 64 memory cell levels, 512 memory cell levels, 1024 memory cell levels, etc.

The dielectric levels 24 comprise insulative material 23. The insulative material 23 may comprise any suitable composition(s); and may, for example, comprise one or more oxides (e.g., silicon dioxide). In some embodiments, the dielectric levels 24 may be referred to as intervening levels provided as spacing between conductive levels 26.

The levels 24 and 26 may be of any suitable thicknesses. The levels 24 may be of different thicknesses than the levels 26, or may be the same thicknesses as the levels 26.

Structures 28 extend through the stack 22 and into the first conductive material 14 of the conductive structure 12. The structures 28 may be referred to as channel material structures in that they comprise channel material 30. The channel material 30 comprises semiconductor material, and may comprise any suitable composition(s). For instance, the channel material 30 may comprise one or more of silicon, germanium, III/V semiconductor materials, semiconductor oxides, etc.

Tunneling material (sometimes referred to as gate dielectric) 32, charge-storage material 34 and charge-blocking material 36 are between the channel material 30 and the vertically-stacked conductive levels 26.

In some embodiments, the tunneling material 32 may comprise, for example, one or more of silicon dioxide, aluminum oxide, hafnium oxide, zirconium oxide, etc.

In some embodiments, the charge-storage material 34 may comprise charge-trapping materials, such as silicon nitride, silicon oxynitride, conductive nanodots, etc. In alternative embodiments (such as an example embodiment described below with reference to FIG. 7), charge-storage material 34 may be configured as floating gate material (such as, for example, polycrystalline silicon).

In some embodiments, the charge-blocking material 36 may comprise one or more of silicon dioxide, aluminum oxide, hafnium oxide, zirconium oxide, etc.

In the illustrated embodiment, the channel material 30 is configured as an upwardly-opening container-shape within each of the structures 28. Insulative material 38 fills such container shapes. The insulative material 38 may comprise any suitable composition or combination of compositions, such as, for example, silicon dioxide. The illustrated structures 28 may be considered to comprise hollow channel configurations, in that the insulative material 38 is provided within "hollows" in the container-shaped channel configurations. In other embodiments (such as an example embodiment described below with reference FIG. 6), the channel material may be configured as a solid pillar.

The channel material structures 28 may be considered to comprise all of the materials 30, 32, 34, 36 and 38, in combination.

The channel material structures 28 are vertically-extending structures which extend upwardly from the conductive structure 12, and which include regions 29 which penetrate into the conductive structure. In some embodiments, the regions 29 may be omitted and the channel material structures 28 may be electrically coupled with the conductive structure 12 without penetrating into the conductive structure 12. For instance, the channel material structures 28 may extend only to an upper surface of the conductive structure 12 rather than extending into the conductive structure 12.

Anchor structures 40 are laterally offset from the channel material structures 28 along the cross-section of FIG. 5. The anchor structures 40 extend through the stack 22, and include regions 41 which penetrate into the conductive structure 12.

The anchor structures 40 may comprise any suitable composition or combination of compositions. In some embodiments, the anchor structures 40 may comprise, consist essentially of, or consist of insulative material (e.g., silicon dioxide, high-k oxide, etc.). In some embodiments, the anchor structures may include conductive material (an example embodiment having conductive material within the anchor structures is described below with reference to FIG. 8).

In the illustrated embodiment of FIG. 5, the channel material structures 28 penetrate into the conductive structure 12 to a first depth D1, and the anchor structures 40 penetrate into the conductive structure 12 to a second depth D2. The second depth D2 is deeper than the first depth D1. In some embodiments, the second depth D2 is greater than the first depth D1 by at least about 30 nanometers (nm), at least about 50 nm, etc.

As mentioned above, in some embodiments the channel material structures 28 do not penetrate into the conductive structure 12. In order to generically encompass embodiments in which channel material structures 28 penetrate into conductive structure 12, as well as embodiments in which the channel material structures 28 do not penetrate into the conductive structure 12, the anchor structures 40 may be considered to penetrate into the conductive structure 12 to a depth which is deeper than any depth to which the channel material structures 28 may penetrate into the conductive structure 12.

Figure 5A:
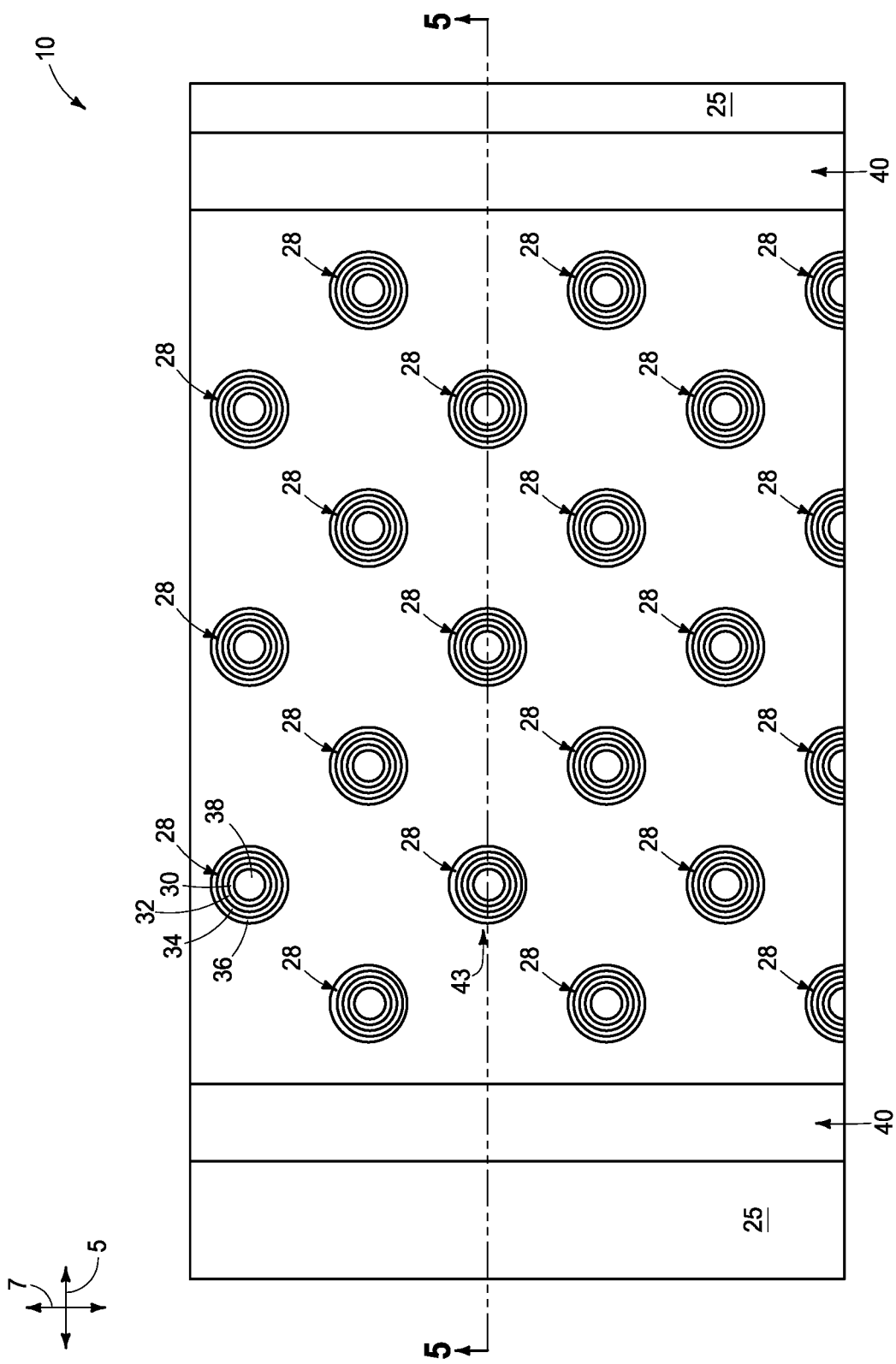
FIG. 5A is a top view of the assembly of FIG. 5. The cross-section of FIG. 5 is along the line 5-5 of FIG. 5A; and the view of FIG. 5A is along the line 5A-5A of FIG. 5.

FIG. 5A shows a top view of the configuration of FIG. 5, and shows that the channel material structures 28 may be arranged in a hexagonally-packed pattern. The channel material structures 28 along the cross-section of FIG. 5 may be considered to be arranged in a row 43 extending along a first direction; with the first direction being represented by an axis 5 adjacent the top view of FIG. 5A. The row 43 comprises a plurality of channel material structures 28 laterally between the anchor structures 40. In the illustrated example embodiment, such plurality includes three of the channel material structures 28. In other embodiments, there may be more than three of the channel material structures along a given row, or fewer than three of the channel material structures along a given row. Persons of ordinary skill in the art can determine an appropriate relationship between the anchor structures 40 and the channel material pillars 28 to achieve desired results (e.g., stability).

In the illustrated embodiment of FIG. 5A, the anchor structures 40 are configured as rails extending along a second direction (represented by the axis 7 adjacent the top view of FIG. 5A). The second direction of axis 7 crosses the first direction of axis 5, and in the illustrated embodiment is substantially orthogonal to the first direction of axis 5 (with the term "substantially orthogonal" meaning orthogonal to within reasonable tolerances of fabrication and measurement).

In some embodiments, the illustrated pair of anchor structures 40 of FIG. 5A may be considered to correspond to a first anchor structure on one side of the row 43 of the channel material structures 28, and to a second anchor structure on the other side of the row 43. In some embodiments, the channel material structures 28 may be considered to be configured in a memory array, and the anchor structures 40 may be utilized to subdivide the memory array amongst blocks, or at least partial blocks (with a "block" corresponding to a collection of memory cells which are erased simultaneously in a block-erase operation).

Referring again to FIG. 5, the conductive structure 12 has a shape along the cross-section of FIG. 5 which includes a pair of downwardly-projecting tooth regions 42 spaced from one another by an intervening region 44.

The tooth regions 42 extend downwardly by a distance D3. Such distance may be any suitable distance, and in some embodiments may be at least about 30 nm, at least about 50 nm, etc. In some embodiments, such distance may be within a range of from about 50 nm to about 500 nm.

One of the tooth regions 42 is shown to have a lateral dimension W2. Such lateral dimension W2 may be any suitable dimension, such as, for example at least about 30 nm, at least about 50 nm, etc. In some example embodiments, the lateral dimension W2 may be within a range of from about 50 nm to about 500 nm. Both of the illustrated tooth regions 42 may have the same lateral dimension as one another, or they may comprise different lateral dimensions relative to one another.

The conductive structure 12 comprises a bottom surface 13, and such bottom surface undulates along the tooth regions 42, and along a ridge region 45 between the tooth regions.

The ridge region 45 has a lateral dimension W1 between the tooth regions 42. Such lateral dimension may be any suitable dimension; such as, for example, at least about 300 nm, at least about 500 nm, etc. In some embodiments, the lateral dimension W1 may be within a range of from about 500 nm to about 5000 nm; or within a range of from about 600 nm to about 2500 nm.

The first conductive material 14 has a first primary thickness T1 over the ridge region 45, and the second conductive material 16 has a second primary thickness T2 over the ridge region 45. The thicknesses T1 and T2 are referred to as "primary thicknesses" to indicate that one or both of the materials 14 and 16 may have a varying thickness; but that the majority of the material across the ridge region 45 has the thickness referred to as the "primary thickness".

The first and second thicknesses T1 and T2 may be any suitable thicknesses; such as, for example, thicknesses of at least about 100 nm, at least about 200 nm, at least about 300 nm, etc. The thicknesses T1 and T2 may be the same as one another, or may be different relative to one another.

In the illustrated embodiment, the channel material structures 28 are over the ridge region 45, and extend into the first conductive material 14 to a depth (D1) which is less than the first primary thickness T1 of the conductive material 14. The anchor structures 40 are over the foot regions 42, and extend into the first and second conductive materials 14 and 16 to a depth (D2) which is greater than the first primary thickness T1. The first and second conductive materials 14 and 16 wraparound the bottom regions 41 of the anchor structures 40. The depths D2 of the anchor regions 40 may have any suitable relationships relative to the combined thicknesses T1 and T2 of the first and second conductive materials 14 and 16. In some embodiments, the depths D2 of the anchor regions 40 may be less than the combined thicknesses T1 and T2 of the first and second conductive materials 14 and 16, may be greater than such combined thicknesses, or may be about equal to such combined thicknesses.

The stack of materials 14, 16, 23 and 25 within the illustrated assembly of FIG. 5 may have mechanical and/or thermal stresses which develop along interfaces where the materials join to one another. It can be difficult in conventional structures to maintain desired stability between a three-dimensional stack of memory cells (analogous to the stack 22 of FIG. 5) and an underlying conductive source line (analogous to the underlying conductive structure 12 of FIG. 5). The anchor structures 40 of the illustrated embodiment may provide mechanical stability to better adhere the various stacked materials 14, 16, 23 and 25 of FIG. 5 as compared to analogous stacked materials of conventional configurations. Further, the undulation within the conductive structure 12 (i.e., the utilization of the tooth regions 42) enables the anchor structures 40 to be anchored deeply into the conductive structure 12 without exposing the metal-containing conductive material 16 to etching conditions (with such conditions being discussed in more detail below with reference to FIGS. 12 and 13), which may advantageously alleviate corrosion of the metal-containing conductive material as compared to that which may occur during conventional processes.

In some applications, it is desired to form the stack 22 to ever-increasing heights in order to enable ever-increasing amounts of memory to be fabricated across a footprint of a semiconductor die. The increasing heights may lead to difficulties in achieving mechanical stability. The anchor structures 40 described herein may provide the additional mechanical stability which enables ever-increasing heights to be achieved. In some embodiments, the stack 22 may extend to a height H above an upper surface of the conductive structure 12 of at least about 5 micrometers (μm), at least about 10 μm, etc. For instance, in some embodiments the height may be within a range of from about 5 μm to about 25 μm. In some embodiments, other materials (not shown in FIGS. 5 and 5A) may be formed across the memory stack 22. Such other materials may include drain-side select devices, digit lines, etc. The anchor structures 40 may extend above the memory stack 22 to assist in providing mechanical stability relative to the materials above the stack 22, or may extend only to the top of the stack 22. Also, in some embodiments additional materials and components are provided within the gap between the stack 22 and the conductive structure 12 (e.g., source-side select devices), and the anchor structures may extend alongside and/or through such other materials and components.

The embodiment of FIGS. 5 and 5A comprises channel material structures 28 having the channel material 30 configured in a hollow channel arrangement. In other embodiments, the channel material may be configured as solid pillars. For instance, FIG. 6 shows a construction 10a similar to the construction 10 of FIGS. 5 and 5A, but in which the channel material 30 of the channel material structures 28 is configured as solid pillars.

In some embodiments, the charge-storage material 34 may be configured as floating gates (e.g., may comprise silicon). FIG. 7 shows a construction 10b similar to the construction 10 of FIGS. 5 and 5A, but in which the charge-storage material 34 is configured as vertically-spaced floating gates. The charge-blocking material 36 and tunneling material 32 are shown merging with one another, as is the case if they comprise a common composition. Such is to simplify the drawing. Persons of ordinary skill in the art will understand that the tunneling material 32 and the charge-blocking material 36 may or may not have a composition in common. The embodiment of FIG. 7 has the channel material 30 in a hollow channel configuration (like that of FIG. 5). In other embodiments, floating gates of the type shown in FIG. 7 may be utilized with solid pillar channels of the type shown in FIG. 6.

Figure 6:
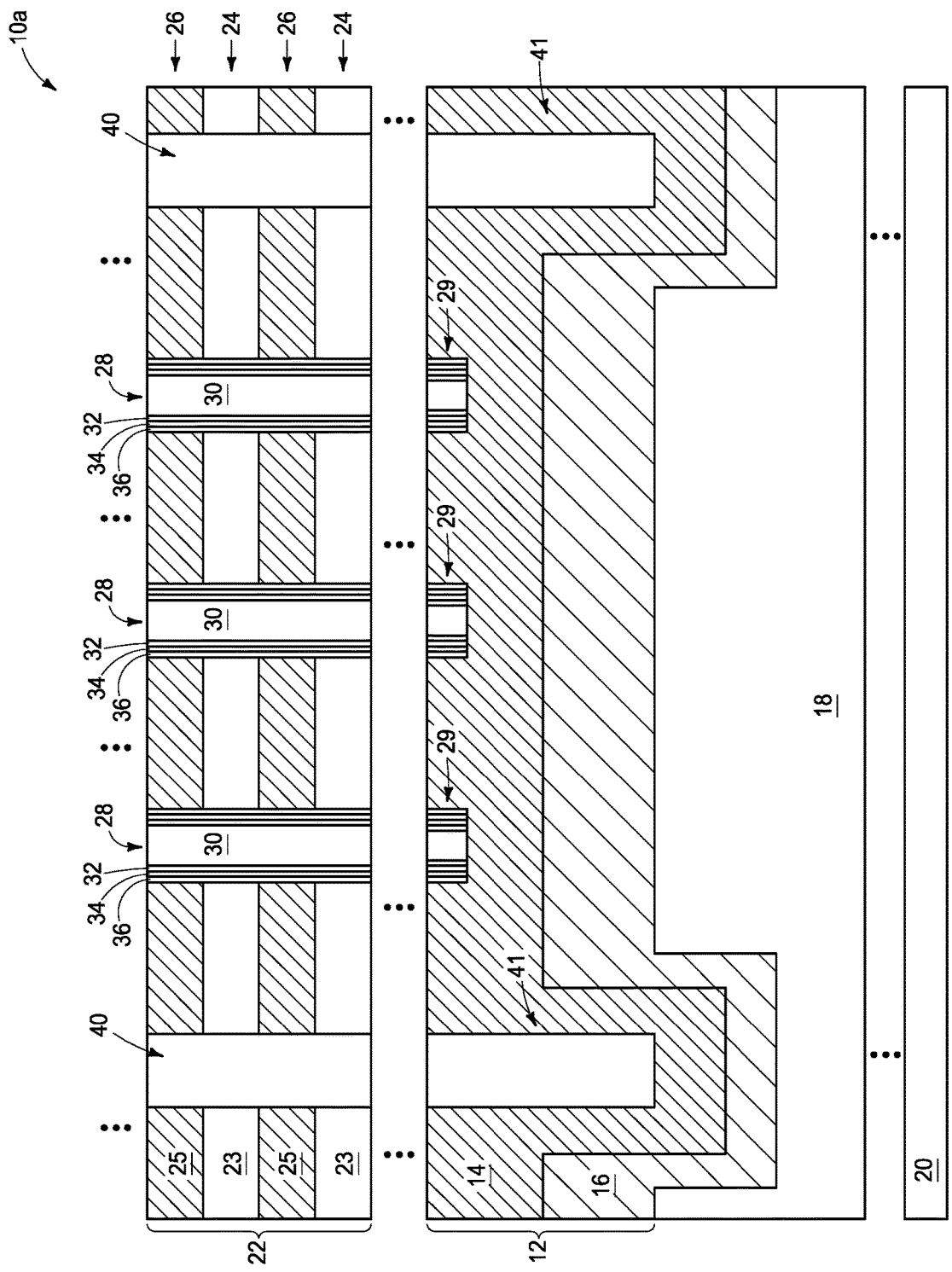
Figure 7:
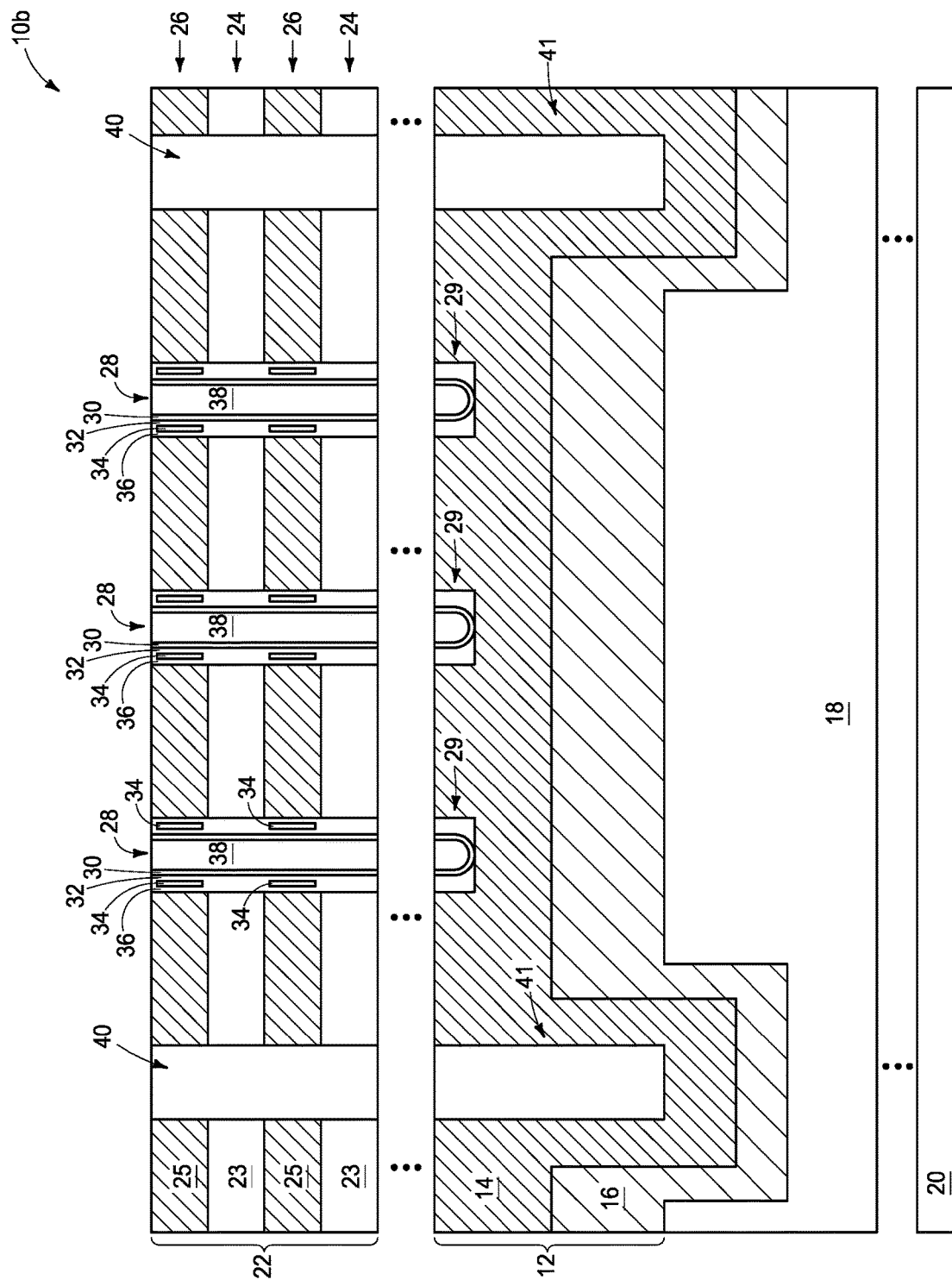
Figure 8:
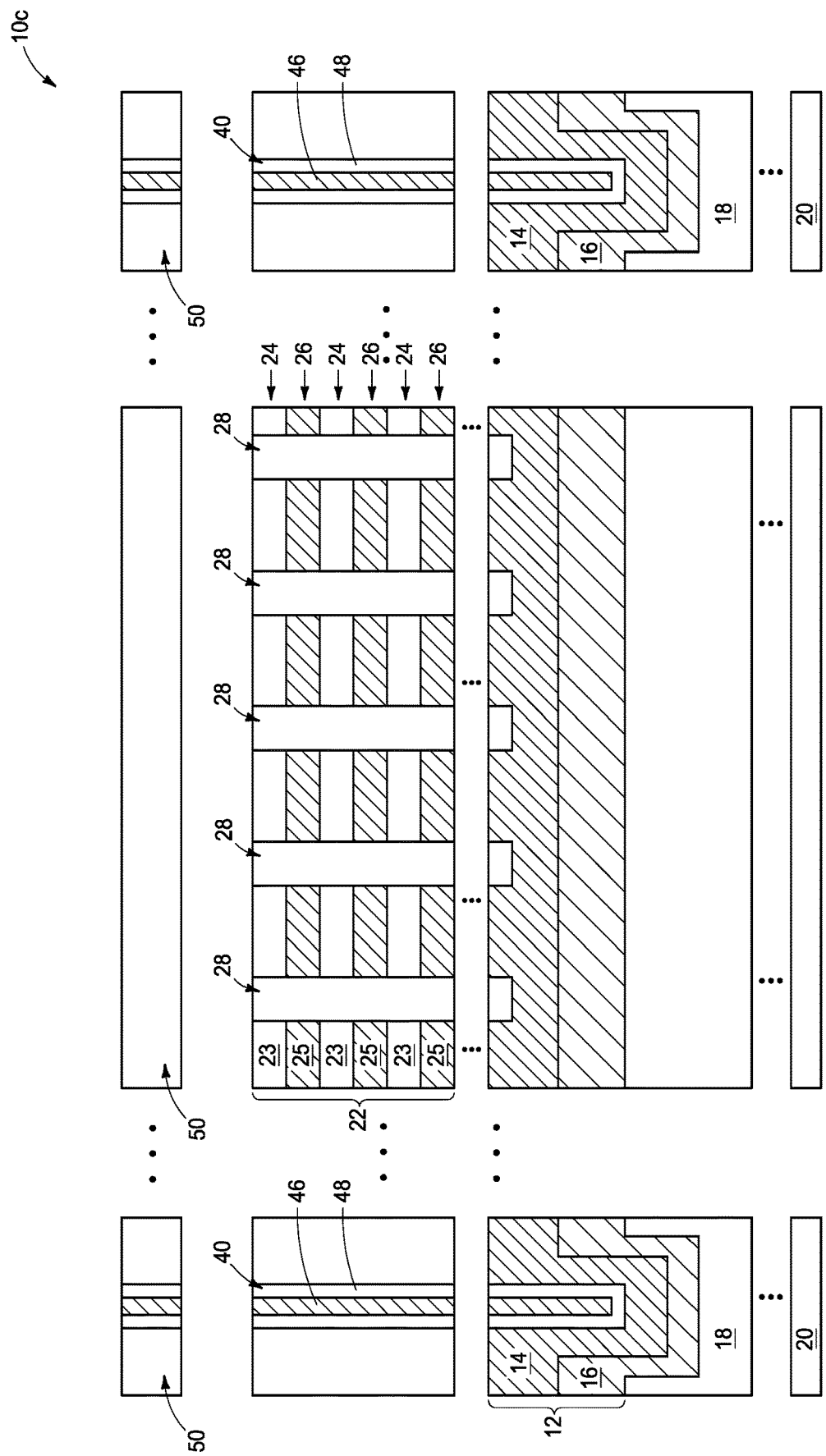

The configurations of FIGS. 5-7 show the anchor structures 40 extending through the stack 22. In other configurations, one or more of the anchor structures 40 may be laterally offset from the stack 22. For instance, FIG. 8 shows a construction 10c in which a pair of the anchor structures 40 are adjacent the stacked 22, and are laterally offset from the stack. The configuration of FIG. 8 shows the channel material structures 28, but does not show the materials 30, 32, 34 and 36 within such channel material structures in order to simplify the drawing. It is to be understood, however, that the channel material structures 28 of FIG. 8 would comprise materials 30, 32, 34 and 36; and may comprise one or more of the configurations described above with reference to FIGS. 5-7.

The anchor structures 40 are shown comprising conductive material 46 and insulative material 48. The conductive material 46 may comprise, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The insulative material 48 may comprise silicon dioxide, high-k oxide, and/or any other suitable composition. The anchor structures 40 are shown comprising two different compositions in order to illustrate that in some embodiments the anchor structures may comprise more than one composition. The anchor structures of FIG. 8 are shown comprising conductive material 46 in order to illustrate that it may be advantageous to include conductive materials in some applications if such provide suitable stability. Alternatively, in some applications it may be desired that the anchor structures 40 only comprise insulative material and/or that the anchor structures comprise only a single homogeneous composition.

FIG. 8 shows that the stack 22 is under other materials and/or components (a region 50 is provided over the stack 22 to diagrammatically represent that other materials and/or components may be over the stack). The other materials and/or components over the stack 22 may include digit lines, drain-side select devices, insulative materials, etc. In some embodiments, one or more of the anchor structures 40 may extend into one or more of the overlying materials; i.e., may extend into the illustrated region 50. In other embodiments, the anchor structures 40 may extend to about the same height as the stack 22.

Figure 9:
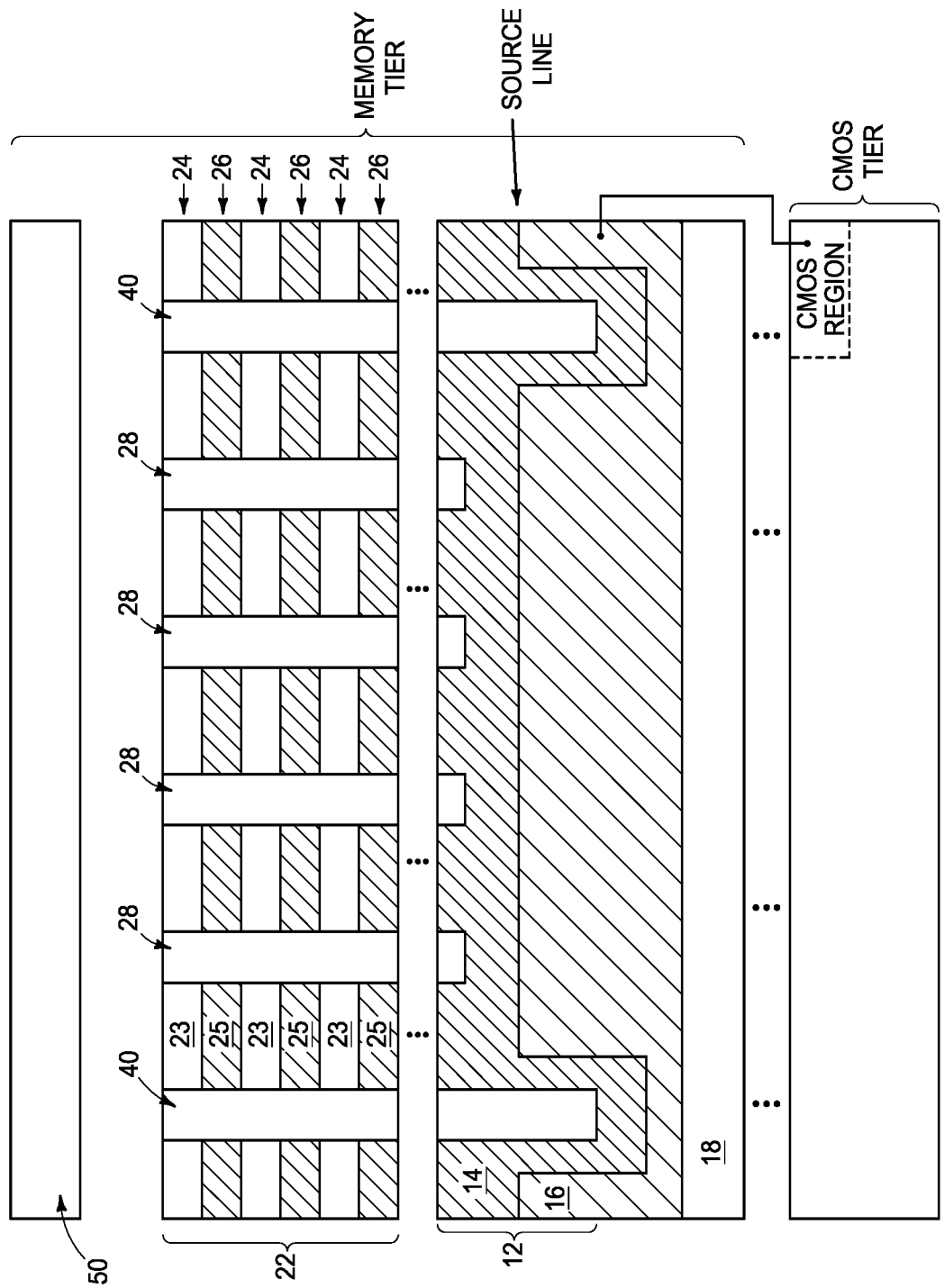
FIG. 9 is a diagrammatic cross-sectional view of an example arrangement comprising an example memory tier over an example CMOS tier.

The stack 22 may be comprised by a memory tier, such as, for example, a tier comprising three-dimensional NAND. FIG. 9 shows the memory tier comprising the stack 22, a source line corresponding to the conductive structure 12, and the overlying region 50 (i.e., a region comprising digit lines, insulative materials, etc.). The memory tier comprises the channel material structures 28, and the anchor structures 40. Channel materials and other materials are not shown within the channel material structures 28 of FIG. 9, but it is to be understood that the channel material structures 28 of FIG. 9 may comprise any of the configurations described above with reference to FIGS. 5-7.

The memory tier is shown to be over another tier, which in the embodiment of FIG. 9 is called out as a CMOS tier. The CMOS tier has circuitry coupled with the source line 12. Such circuitry extends from a CMOS region of the CMOS tier. In some embodiments, the CMOS region may comprise logic circuitry and/or any other appropriate circuitry for controlling electrical flow along the source line 12 during operation of memory associated with the memory tier. Although the CMOS region is shown coupled only with the source line, it is to be understood that the CMOS region of the CMOS tier may also be coupled with other components associated with the memory tier (e.g., wordlines, digit lines, etc.).

Although the CMOS region is shown to be within a CMOS tier under the memory tier in the configuration of FIG. 9, it is to be understood that in other configurations the CMOS region may be in any other suitable location relative to the memory tier (i.e., above the memory tier, beside the memory tier, etc.).

The configurations described above may be fabricated with any suitable processing. Example processing is described with reference to FIGS. 10-17; with FIGS. 10-13 being utilized to describe a first example process sequence, and FIGS. 14-17 being utilized to describe a second example process sequence.

Figure 10:
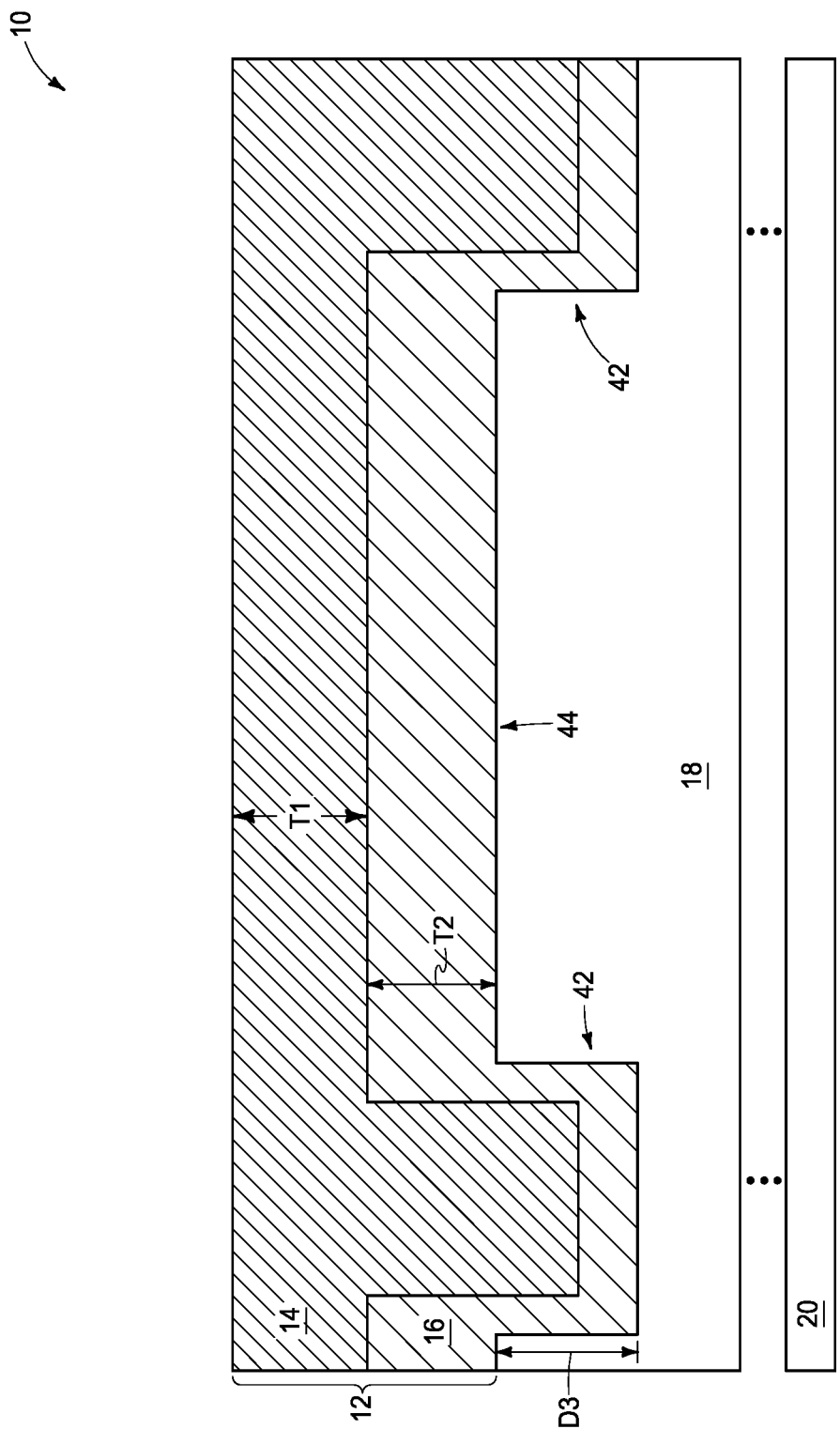
FIGS. 10-13 are diagrammatic cross-sectional views of an example construction at process stages of an example method for fabricating the example assembly of FIG. 5.

Referring to FIG. 10, construction 10 is shown at a processing stage in which the construction comprises the conductive structure 12 formed over the insulative material 18. The conductive structure 12 comprises the tooth regions 42, and the intervening region 44 between the tooth regions. The conductive structure comprises the first conductive material 14 over the second conductive material 16. The first conductive material 14 comprises the first primary thickness T1 within the intervening region 44, and the second conductive material 16 comprises the second primary thickness T2 within the intervening region 44. In some embodiments, the first conductive material 14 may comprise semiconductor material (for instance, conductively-doped silicon), and the second conductive material 16 may comprise metal (for instance tungsten, at least some of which may be in the form of tungsten silicide).

The tooth regions 42 extend into the material 18 to the depth D3. In some embodiments, the tooth regions 42 extend to a depth which is at least about 30 nm deeper than the intervening region 44, at least about 50 nm deeper than the intervening region 44, etc.

Figure 11:
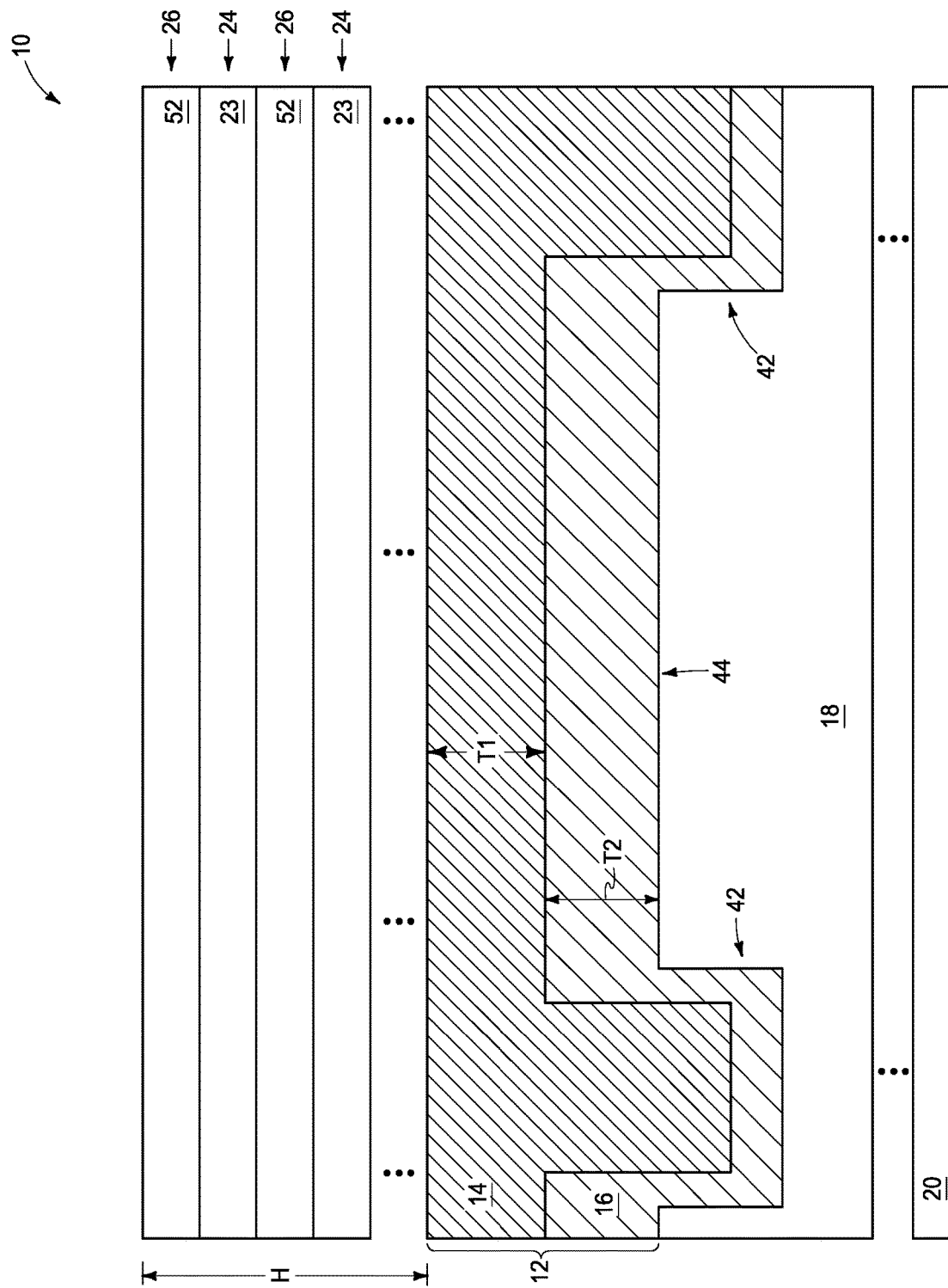

Referring to FIG. 11, vertically-stacked first and second levels 24 and 26 are formed over the conductive structure 12. The first levels 24 comprise the dielectric material 23, and the second levels 26 comprise sacrificial material 52. The sacrificial material 52 may comprise any suitable composition or combination of compositions; and in some embodiments may comprise, consist essentially of, or consist of silicon nitride.

The vertically-stacked first and second levels extend to the height H over the conductive structure 12. In some embodiments, such height may be at least about 5 µm, at least about 10 µm, at least about 20 µm, at least about 25 µm, etc.

Figure 12:
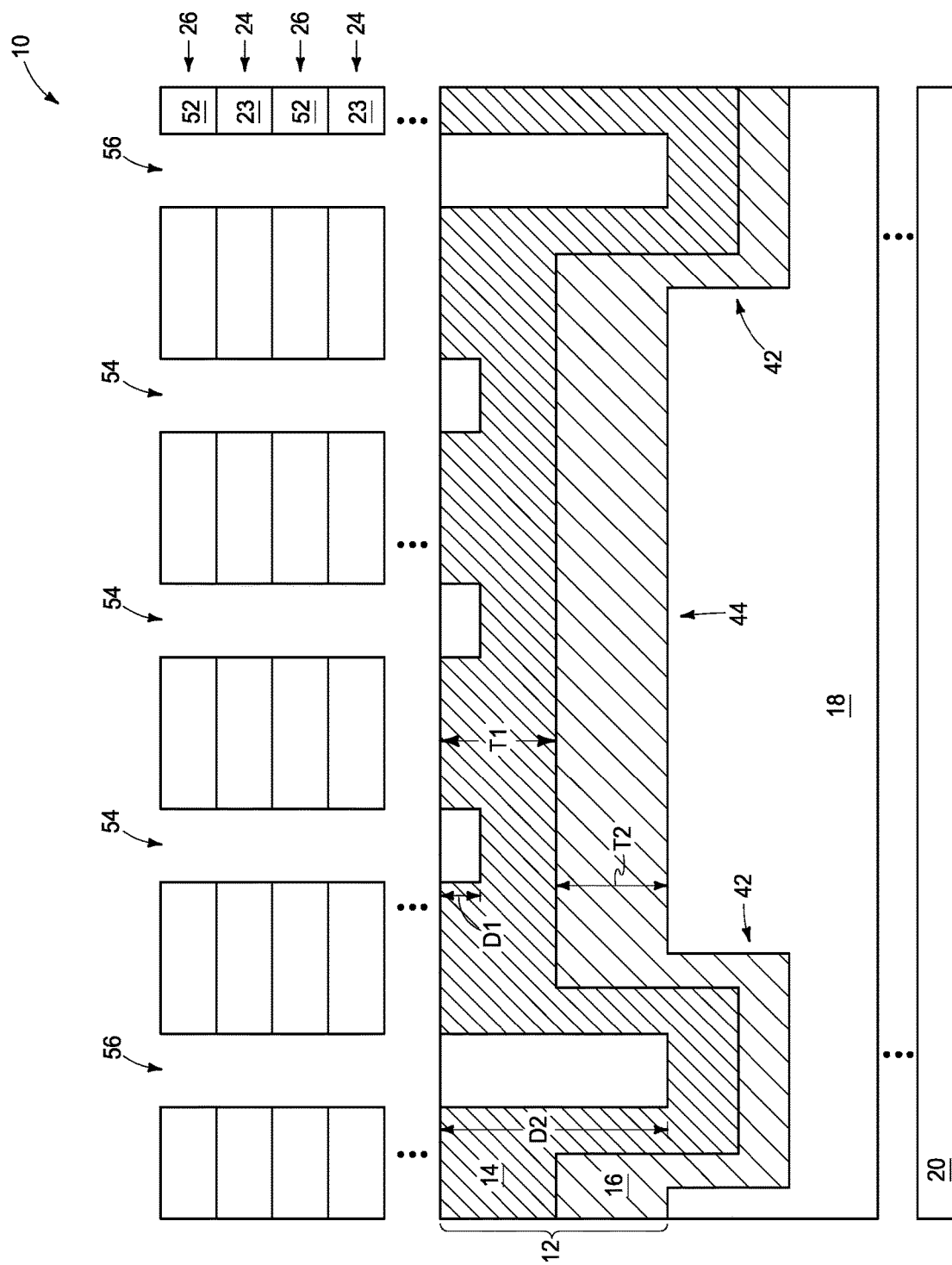

Referring to FIG. 12, first openings 54 are formed to extend through the first and second levels 24 and 26, and into the intervening region 44 of the conductive structure 12. The first openings 54 penetrate into the first conductive material 14 to the depth D1 of less than or equal to about one-half of the first thickness T1. Also, second openings 56 are formed to extend through the first and second levels 24 and 26 and into the tooth regions 42 of the conductive structure 12. The second openings 56 penetrate into the first conductive material 14 to the depth D2 greater than the first thickness T1.

The first and second openings 54 and 56 may be formed with any suitable processing, and may be formed simultaneously with one another or sequentially relative to one another. In some embodiments, a first patterned mask may be provided over an upper surface of the construction 10 and utilized to define locations of the first openings 54. Specifically, the first openings 54 may be etched through the levels 24 and 26, and into the conductive material 14 with one or more suitable etches. Subsequently, the mask may be removed and sacrificial material may be provided within openings 54. Subsequently, another mask is provided to define locations of the second openings 56; the openings 56 are etched through levels 24 and 26 and into the conductive material 14 of the foot regions 42, and the mask is removed. Then, the sacrificial material within openings 54 may be removed to leave the construction of FIG. 12. Alternatively, similar processing may be utilized but the openings 56 may be formed prior to the openings 54.

Figure 13:
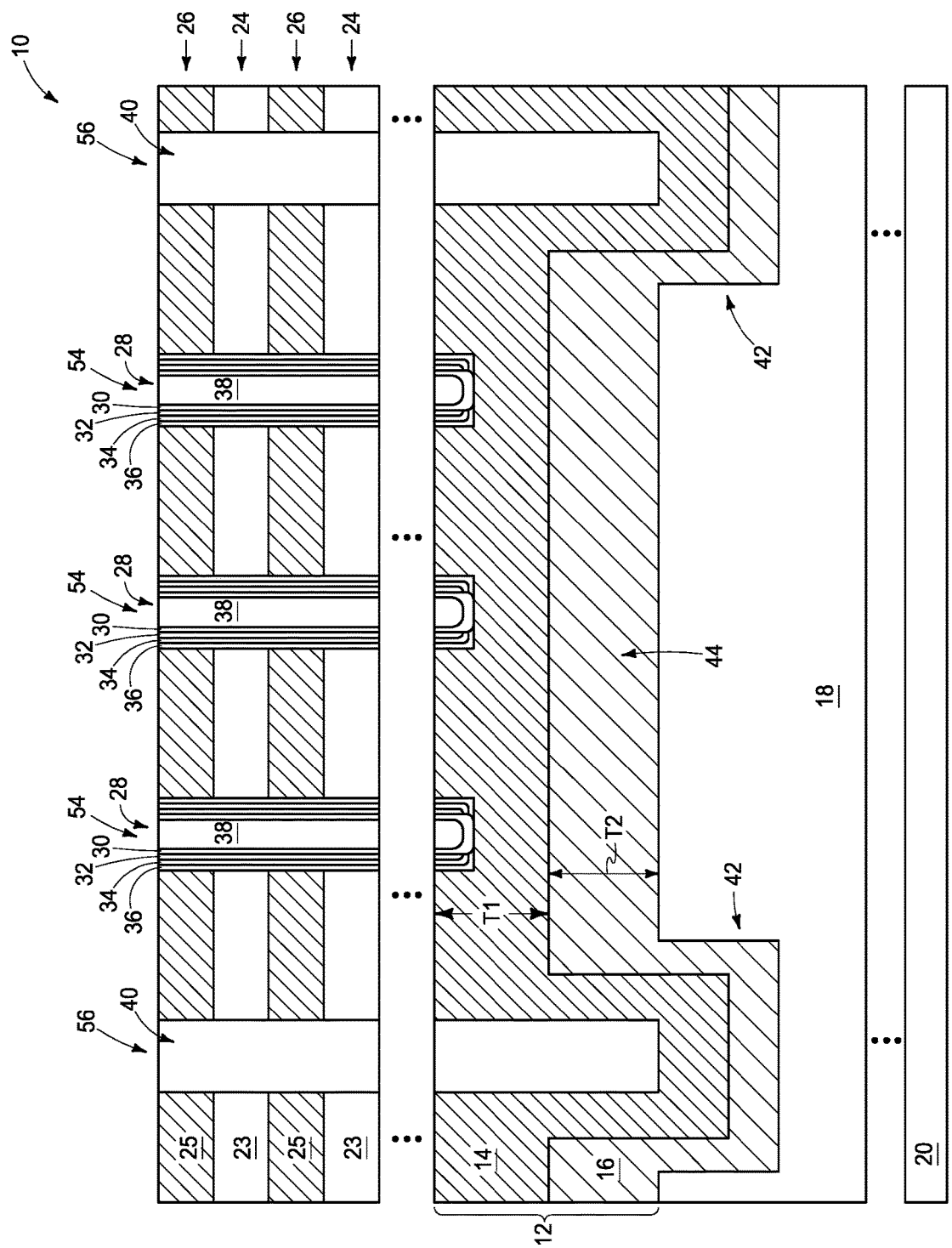

Referring to FIG. 13, the sacrificial material 52 (FIG. 12) is removed with one or more appropriate etches, and replaced with conductive wordline material 25. The etching may be conducted with etchant provided within openings 54 and 56 (FIG. 12). Subsequently, excess conductive material 25 may be removed from within openings 54 and 56; and then the channel material structures 28 are formed within the first openings 54, and the anchor structures 40 are formed within the second openings 56.

The removal of the sacrificial material 52 may utilize hot phosphoric acid, or any other suitable conditions. A problem with conventional methods utilizing processing analogous to that of FIGS. 12 and 13 may be that the upper conductive material 14 of a source line 12 may comprise silicon which is pierced by the etching utilized to remove the sacrificial material 52. Such exposes the underlying metal-containing material 16 of the source line 12 to galvanic conditions which may detrimentally lead to corrosion of the metal-containing material and to increased resistance along the metal-containing material. In contrast, processing described herein relative to the embodiment of FIGS. 12 and 13 may enable the conductive material 14 to be thick enough around the openings 54 and 56 that such material 14 is not pierced to expose the metal-containing material 16 during the removal of the sacrificial material 52. Accordingly, the detrimental corrosion and increased resistance of metal-containing material 16 of a conductive source line 12 may be avoided with processing described herein, which may advantageously improve performance characteristics of assemblies formed utilizing such processing as compared to conventional assemblies. In some embodiments, the processing described herein may be utilized to fabricate three-dimensional memory (e.g., three-dimensional NAND memory arrays) having improved performance characteristics relative to analogous memory fabricated in a conventional manner.

Another example process sequence is described with reference to FIGS. 14-17.

Figure 14:
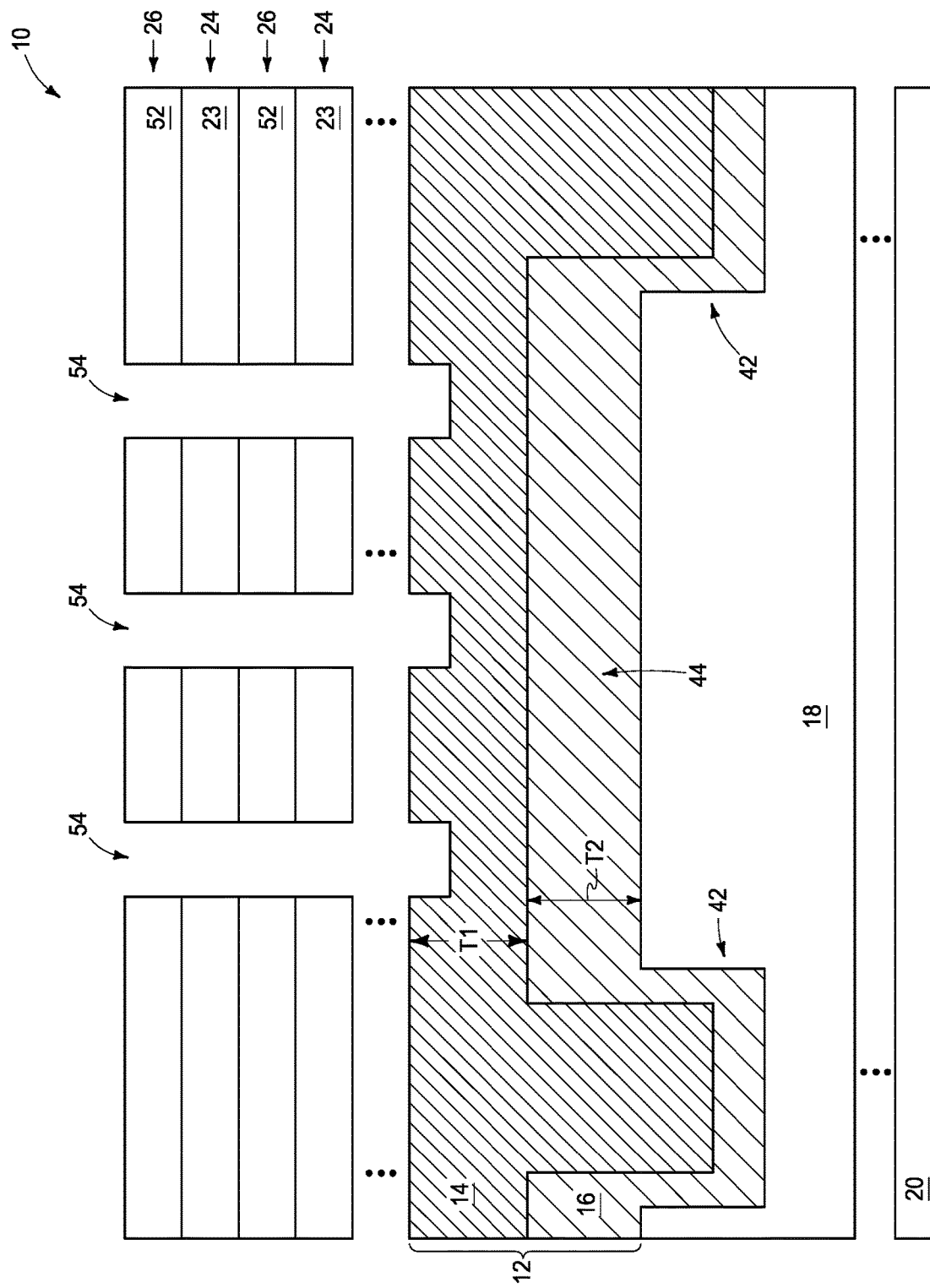
FIGS. 14-17 are diagrammatic cross-sectional views of an example construction at process stages of another example method for fabricating the example assembly of FIG. 5. The process stage of FIG. 14 may follow that of FIG. 11 in some embodiments.

Referring to FIG. 14, the construction 10 is shown at a process stage that may follow that of FIG. 11. The first openings 54 are formed to extend through the first and second levels 24 and 26, and into the intervening region 44 of the conductive structure 12. The first openings 54 penetrate into the first conductive material 14 to the depth D1 of less than or equal to about one-half of the first thickness T1.

Figure 15:
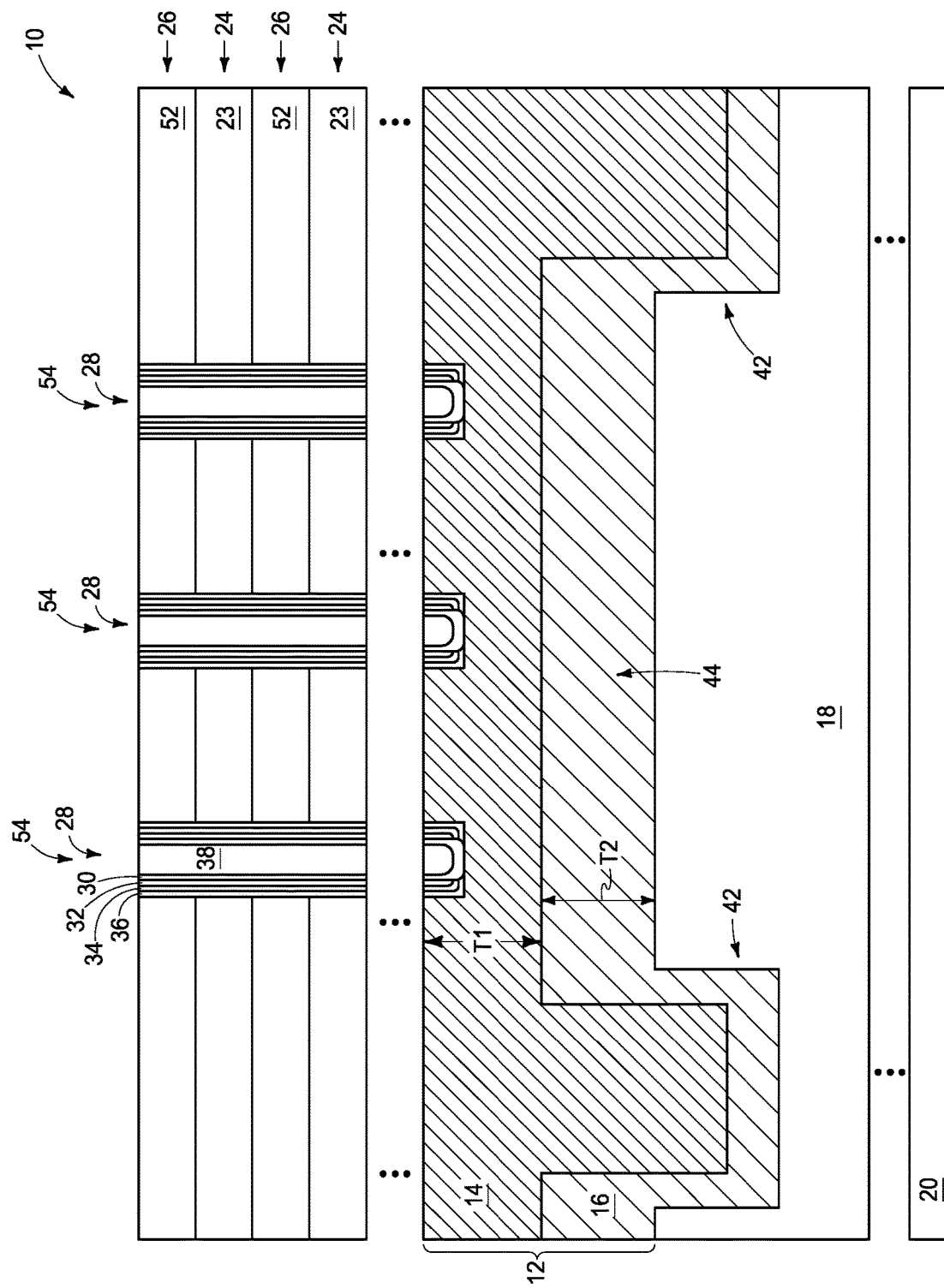

Referring to FIG. 15, the channel material structures 28 are formed within the first openings 54.

Figure 16:
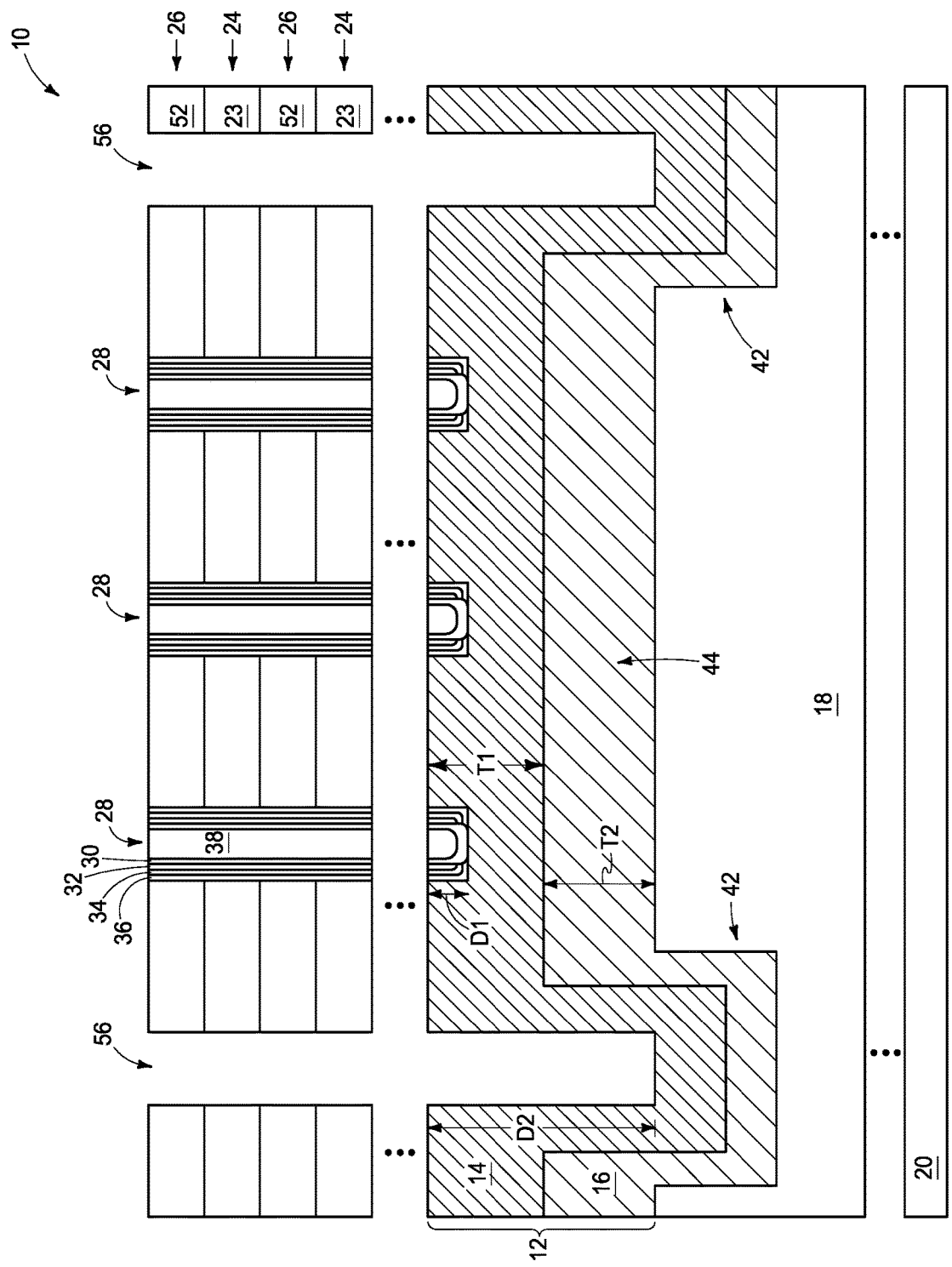

Referring to FIG. 16, the second openings 56 are formed to extend through the first and second levels 24 and 26 and into the tooth regions 42 of the conductive structure 12. The second openings 56 penetrate into the first conductive material 14 to the depth D2 greater than the first thickness T1.

Figure 17:
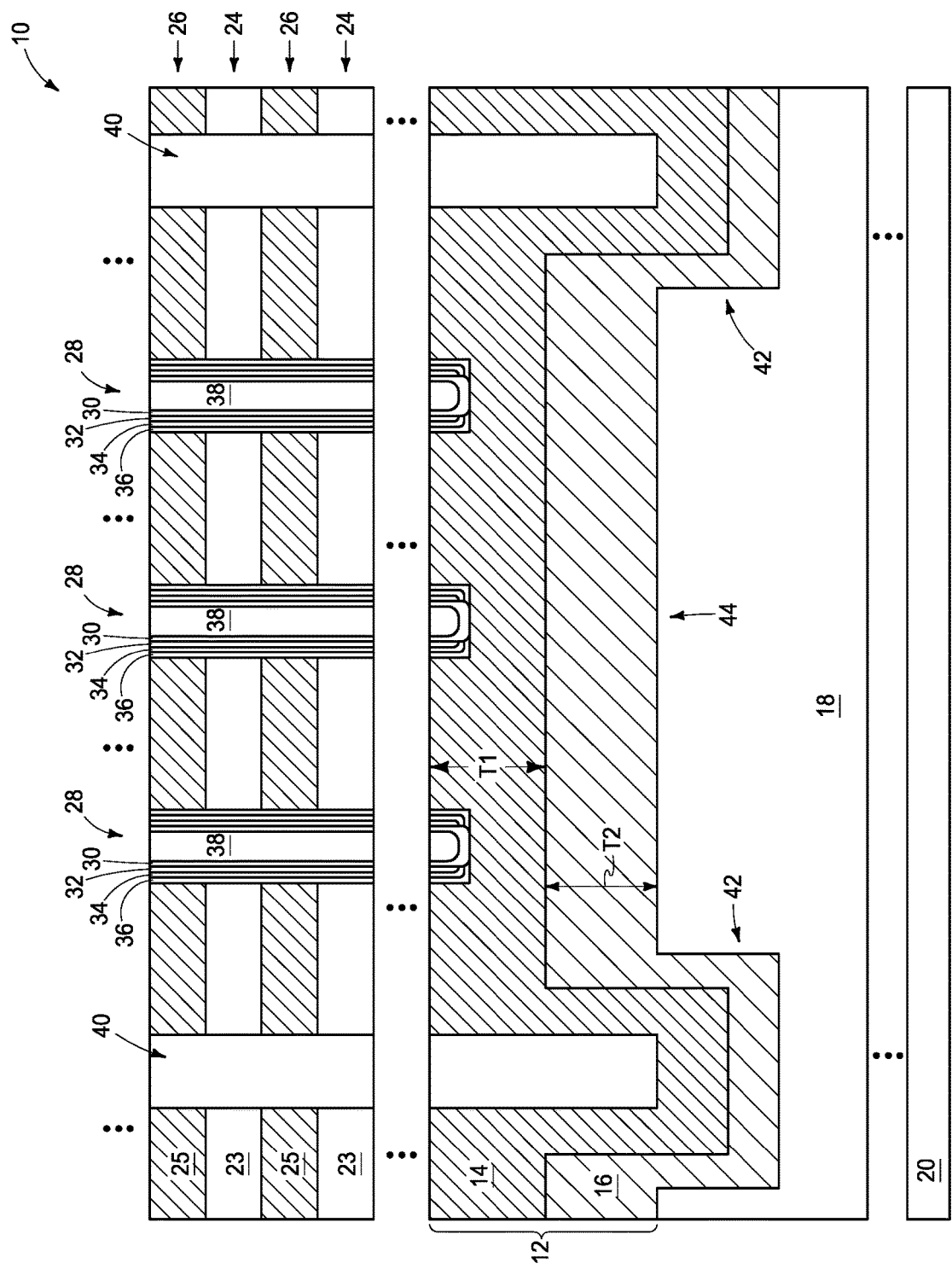

Referring to FIG. 17, the sacrificial material 52 (FIG. 16) is removed with one or more appropriate etches, and replaced with conductive wordline material 25. The etching may be conducted with etchant provided within openings 56 (FIG. 16). Subsequently, excess conductive material 25 may be removed from within the second openings 56, and then the anchor structures 40 are formed within the second openings 56.

The structures and assemblies discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an assembly having channel material structures over a conductive structure, and having channel material which is electrically coupled with the conductive structure. Anchor structures are laterally offset from the channel material structures and penetrate into the conductive structure to a depth which is greater than any depth to which the channel material structures penetrate into the conductive structure.

Some embodiments include an assembly which comprises an insulative material and a conductive structure over the insulative material. The conductive structure comprises a first conductive material over a second conductive material. The conductive structure has an undulating bottom surface along a cross-section. The undulating bottom surface includes a ridge region between a pair of foot regions, with the ridge region being above the foot regions by at least about 30 nm. The first conductive material has a first primary thickness over the ridge region, and the second conductive material has a second primary thickness over the ridge region. Channel material structures are over the ridge region and extend into the first conductive material to a first depth which is less than the first primary thickness. Anchor structures are over the foot regions and extend into the first and second conductive materials to a second depth which is greater than the first primary thickness. The first and second conductive materials wrap around bottom regions of the anchor structures.

Some embodiments include a method of forming an integrated structure. A conductive structure is formed over an insulative material. The conductive structure comprises a first conductive material over a second conductive material. The conductive structure has a shape, along a cross-section, of a pair of downwardly-projecting tooth regions spaced from one another by an intervening region. The first conductive material has a first thickness within the intervening region and the second conductive material has a second thickness within the intervening region. The first conductive material comprises semiconductor material and the second conductive material comprises metal. Vertically-stacked first and second levels are formed over the conductive structure. The first levels comprise insulative material and the second levels comprise sacrificial material. First openings are formed to extend through the first and second levels and into the intervening region of the conductive structure. The first openings penetrate into the first conductive material to a depth less than or equal to about one-half of the first thickness. After the first openings are formed, the sacrificial material is removed and conductive wordline material is formed within the second levels. Channel material structures are formed within the first openings. Second openings are formed to extend through the first and second levels and into the tooth regions of the conductive structure. The second openings penetrate into the first conductive material to a depth greater than the first thickness. Anchor structures are formed within the second openings.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An assembly, comprising:
   an insulative material;
   a conductive structure over the insulative material;
   the conductive structure comprising a first conductive material over a second conductive material;
   the conductive structure having an undulating bottom surface along a cross-section;
   the undulating bottom surface including a ridge region between a pair of foot regions, with the ridge region being above the foot regions by at least about 30 nm;
   the first conductive material having a first primary thickness over the ridge region, and the second conductive material having a second primary thickness over the ridge region;
   a stack of materials over the conductive structure, the stack of materials comprising dielectric levels alternating with conductive levels;
   channel material structures over the ridge region and extending through the stack of materials into the first conductive material to a first depth which is less than the first primary thickness; and
   anchor structures over the foot regions and extending through the stack of materials into the first and second conductive materials to a second depth which is greater than the first primary thickness;
   the first and second conductive materials wrapping around bottom regions of the anchor structures;
   wherein the ridge region has a lateral dimension of at least about 300 nm between the foot regions;
   wherein each individual foot region has a lateral dimension along the cross-section within a range of from about 50 nm to about 500 nm.

2. The assembly of claim 1 wherein the second depth is less than the combined first and second primary thicknesses.

3. The assembly of claim 1 wherein the second depth is greater than the combined first and second primary thicknesses.

4. The assembly of claim 1 wherein the ridge region is above the foot regions by at least about 50 nm.

5. The assembly of claim 1 wherein the ridge region is above the foot regions by a distance within a range of from about 50 nm to about 500 nm.

6. The assembly of claim 1 wherein the lateral dimension is within a range of from about 500 nm to about 5000 nm.

7. The assembly of claim 1 wherein the lateral dimension is within a range of from about 600 nm to about 2500 nm.

8. The assembly of claim 1 further comprising CMOS circuitry coupled with the conductive structure.

9. The assembly of claim 1 wherein the conductive structure, anchor structures and channel material structures are part of a memory tier; and further comprising a CMOS tier under the memory tier and having CMOS circuitry coupled with the conductive structure.

* * * * *